United States Patent
Rieux-Lopez

(10) Patent No.: US 8,415,992 B2
(45) Date of Patent: Apr. 9, 2013

(54) GENERATOR OF A.C. SIGNALS, SUCH AS REFERENCE SIGNALS, AND AIRCRAFT EQUIPPED WITH SUCH A GENERATOR

(75) Inventor: Olivier Rieux-Lopez, Lisle sur Tarn (FR)

(73) Assignee: Airbus Operations SAS, Toulouse (FR)

( * ) Notice: Subject to any disclaimer, the term of this patent is extended or adjusted under 35 U.S.C. 154(b) by 338 days.

(21) Appl. No.: 11/675,877

(22) Filed: Feb. 16, 2007

(65) Prior Publication Data
US 2007/0194780 A1 Aug. 23, 2007

(30) Foreign Application Priority Data

Feb. 17, 2006 (FR) .................................. 06 01432

(51) Int. Cl.
*H03B 28/00* (2006.01)
(52) U.S. Cl.
USPC .......................................................... 327/129
(58) Field of Classification Search .................... 327/129
See application file for complete search history.

(56) References Cited

U.S. PATENT DOCUMENTS

| | | | | | |
|---|---|---|---|---|---|
| 3,223,925 | A | * | 12/1965 | Florac, Jr. et al. | 375/307 |
| 3,671,871 | A | * | 6/1972 | Malm | 327/107 |
| 3,715,665 | A | * | 2/1973 | Chang | 375/231 |
| 4,153,880 | A | * | 5/1979 | Navratil | 327/129 |
| 4,285,044 | A | * | 8/1981 | Thomas et al. | 708/276 |
| 4,297,698 | A | | 10/1981 | Pauwels et al. | |
| 4,599,560 | A | | 7/1986 | Sanford et al. | |
| 5,120,986 | A | * | 6/1992 | Shekhawat | 327/129 |
| 5,644,224 | A | * | 7/1997 | Howard | 324/165 |
| 6,011,508 | A | * | 1/2000 | Perreault et al. | 342/350 |
| 6,469,469 | B1 | * | 10/2002 | Chambers et al. | 318/801 |
| 7,183,868 | B1 | * | 2/2007 | Wessendorf | 331/158 |
| 2002/0190763 | A1 | * | 12/2002 | Ueki | 327/129 |
| 2003/0001683 | A1 | | 1/2003 | Kawajiri et al. | |

FOREIGN PATENT DOCUMENTS

EP 1 418 426 A1 5/2004
FR 2 538 535 6/1984

OTHER PUBLICATIONS

P. Vuillod, et al., "Clock-skew optimization for peak current reduction", ISLPED, Proceedings of the International Symposium on Low Power Electronics and Design, XP-002300952, Aug. 14, 1996, pp. 265-270.

Reinaldo Perez, et al., "Noise Control in Modern Position Sensor Design for Avionics", Electromagnetic Compatibility, 1999 IEEE, vol. 2, International Symposium on Seattle, WA, USA, XP010360746, Aug. 2, 1999, pp. 751-755.

* cited by examiner

*Primary Examiner* — Lincoln Donovan
*Assistant Examiner* — Shikha Goyal
(74) *Attorney, Agent, or Firm* — Oblon, Spivak, McClelland, Maier & Neustadt, L.L.P.

(57) ABSTRACT

An a.c. signal generator is provided with a first circuit ($B_1$) capable of generating alternations of a first a.c. signal ($S_1$) between a first potential ($V^+$) formed by a first voltage source and a second potential ($V^-$).

A second circuit ($B_2$) is capable of generating alternations of a second a.c. signal ($S_2$), phase-shifted relative to the first signal ($S_1$), between the first potential ($V^+$) formed by the first voltage source and the second potential ($V^-$).

Such a generator can be used, for example, in a flight control calculator of an aircraft.

16 Claims, 4 Drawing Sheets

GENERATOR OF A.C. SIGNALS, SUCH AS REFERENCE SIGNALS, AND AIRCRAFT EQUIPPED WITH SUCH A GENERATOR

The present invention relates to a generator of a.c. signals, such as reference signals intended for sensors, for example, and to an aircraft equipped with such a generator.

It is generally desirable that such generators deliver signals (of voltage and/or current type) with characteristics that are as regular as possible (generally meaning as constant as possible). This is the case in particular when these signals are used as reference signals, for example in sensors.

With this goal, there are frequently used mechanisms for regulating voltage sources from which the signals are generated, in order to limit, as much as possible, the variation of characteristics of the voltages supplied (or in other words the potentials formed) by these voltage sources as a result of consumed power variations necessarily induced by generation of an a.c. signal.

Such variations occur in particular when the alternations develop between a first potential generated by a first voltage source (and consequently supplied mainly thereby) and a second potential, for example when the positive alternations of the generated a.c. signal are formed by means of a positive voltage source while the negative alternations of this signal are formed by a negative voltage source. In these cases, in fact, each voltage source is mainly under load for only one half period, which implies large variations in the power that it supplies.

The amplitude of these variations is additionally multiplied when several a.c. signals are generated (such as reference signals, each intended for a particular sensor), each in phase with the same reference, as is commonly the case, with the result that all are in phase with one another.

The invention proposes to reduce the variations in power demanded by each voltage source, in order to limit the complexity of the regulating mechanisms and to improve the regularity of the delivered signals.

To accomplish this, the invention provides an a.c. signal generator provided with a first circuit capable of generating alternations of a first a.c. signal between a first potential formed by a first voltage source and a second potential, characterized by a second circuit capable of generating alternations of a second a.c. signal, phase-shifted relative to the first signal, between the first potential formed by the first voltage source and the second potential.

Thus, by virtue of the phase shift, the voltage source is loaded at different instants by each of the first and second circuits (especially for generating the peak signal), which tends to limit the variations of consumed power in the course of one period.

The phase shift between the first signal and the second signal is generally greater than 30°, in order to achieve an advantageous distribution of load on the voltage source over the period.

The second potential is formed, for example, by a second voltage source. The loading of this second voltage source by the first and second circuits therefore also takes place at different instants over the period.

According to one conceivable embodiment possibility, the first a.c. signal and the second a.c. signal each have a phase determined relative to a phase reference signal, delivered for example by a waveform generator, which makes it possible to limit the number of phase reference signals to be produced.

According to a first embodiment, the first circuit is capable of receiving the phase reference signal and generating the first a.c. signal in phase with the phase reference signal, while the second circuit is capable of receiving the phase reference signal and generating the second a.c. signal with a phase shift relative to the phase reference signal.

The phase shift is therefore achieved within the second circuit.

To accomplish this when it is desired to use a phase shift of 180°, the second circuit can comprise an inverter circuit, which constitutes a practical solution.

According to a second embodiment, the first circuit is capable of receiving the phase reference signal and generating the first a.c. signal in phase with the phase reference signal, and the second circuit receives the phase reference signal via phase-shifting means and is capable of generating the second a.c. signal in phase with the signal received from the phase-shifting means.

The phase shift is therefore achieved at least partly by the phase-shifting means, which in a particularly practical embodiment can comprise, for example, an inverter circuit.

The generator can also be provided with a third circuit capable of generating alternations of a third a.c. signal, in phase relative to the first signal, between the first potential formed by the first voltage source and the second potential.

Alternatively, in order once again to distribute the consumed power over the period when it is wished to use a third a.c. signal, the generator can be provided with a third circuit capable of generating alternations of a third a.c. signal, phase-shifted relative to the first signal and the second signal, between the first potential formed by the first voltage source and the second potential.

Within this framework, and when the system comprises exactly three circuits, the use of a phase shift of 120° between the different signals is particularly appropriate. (In general, with N circuits all phase-shifted relative to one another, a phase shift of 360°/N is particularly advantageous).

In one conceivable application, the first signal and the second signal can be reference signals. The reduction of consumed power variations is particularly advantageous in this case. For example, the first signal is intended for a first sensor and the second signal is intended for a second sensor different from the first sensor.

In this latter case, the sensors are generally independent and do not need the planned phase shift. Nevertheless, the first and second sensors are such that they permit a phase shift between the first signal and the second signal.

Such a generator can be used, for example, in a flight control calculator of an aircraft.

Other characteristics and advantages of the invention will become apparent in the light of the attached drawings, wherein:

FIG. 1 shows the main elements of an a.c. signal generator, in an example integrated into a flight control calculator of an aircraft.

Figure 1:
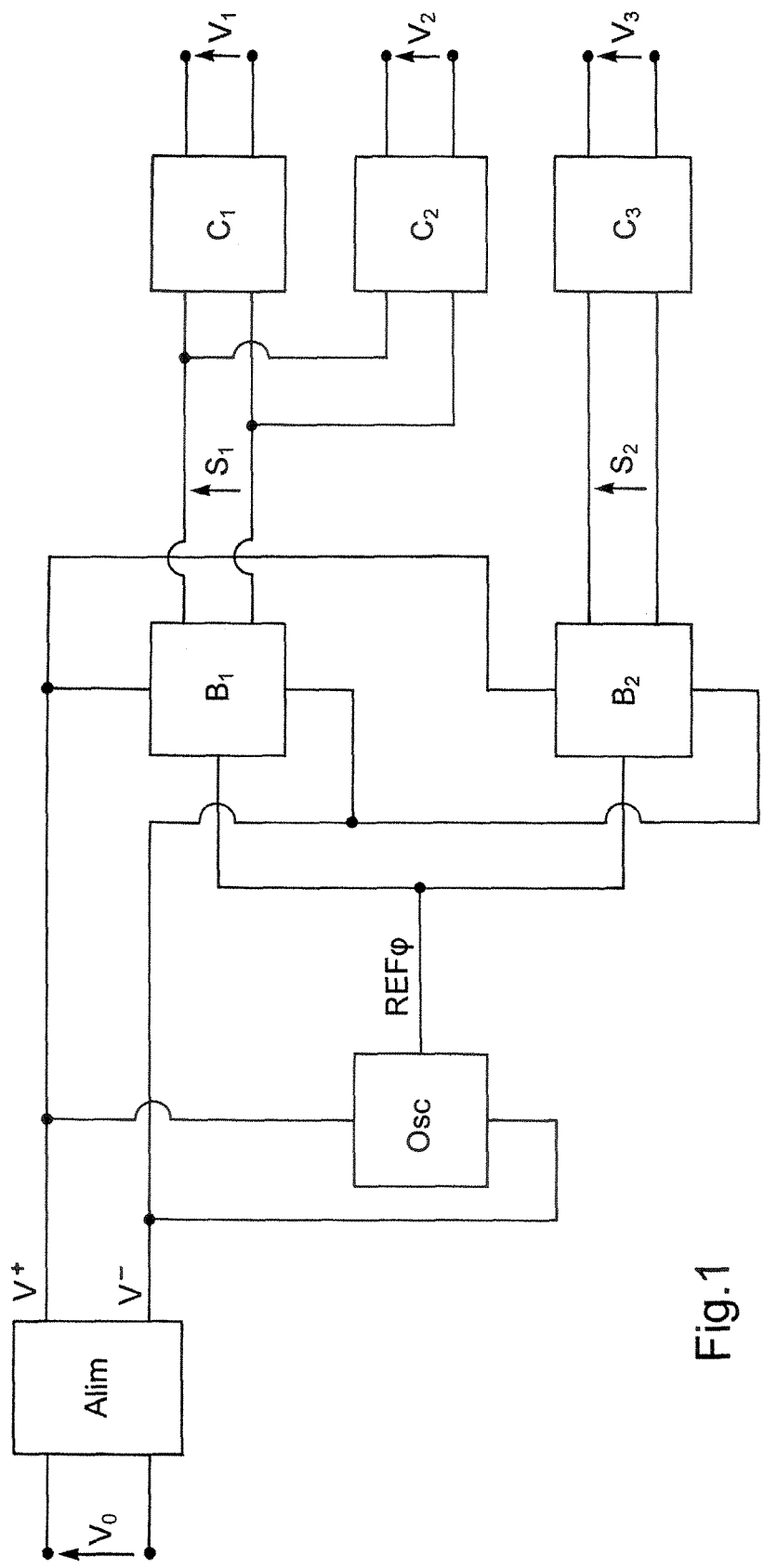
FIG. 1 shows an a.c. signal generator according to a first embodiment of the invention.

The generator of FIG. 1 is provided with a stabilized power supply Alim, which delivers, from a voltage $V_0$, on the one hand a positive d.c. voltage (or potential) $V^+$ and on the other hand a negative d.c. voltage $V^-$.

In the case described here, the voltage $V_0$ is a d.c. voltage present on the electrical system of the aircraft, with a value, for example, of 28 V. Alternatively, it would be possible to use any other source of electrical energy and an appropriate converter to generate the aforesaid positive and negative voltages $V^+$ and $V^-$.

The stabilized power supply therefore forms a source of positive voltage $V^+$ and a source of negative voltage $V^-$, which respectively supply, for example, a voltage of 15 V and a voltage of −15 V.

The positive voltage $V^+$ and the negative voltage $V^-$ are naturally understood to be relative to a ground (zero reference) common to a stabilized power supply Alim and to the other components supplied by these voltages, especially the waveform generator Osc and the generating blocks $B_1$ and $B_2$ described hereinafter.

It will be noted that, for reasons of clarity, the connections of these different elements to ground have not been shown in FIG. 1.

The generator of FIG. 1 is also provided with a waveform generator Osc, supplied by each of the sources of positive and negative voltages $V^+$ and $V^-$ and delivering a signal $REF_\phi$ representative of a phase reference intended for generating blocks $B_1$ and $B_2$ described hereinafter.

Waveform generator Osc in the present case is constructed from digital circuits, which, by virtue of a clock and counters, generate a square-wave signal, smoothed if necessary to obtain a quasi-sinusoidal form after filtering, for example by means of a filter based on passive elements.

Alternatively, the signal $REF_\phi$ representative of a phase reference could be generated by analog means such as an oscillator.

In all cases, the signal $REF_\phi$ representative of a phase reference is a periodic and generally sinusoidal signal, having a frequency, for example, between 1 kHz and 1 MHz, in the present case 2 kHz.

Generating block $B_1$ (or "buffer" according to English terminology) is supplied on the one hand by the source of positive voltage $V^+$ and on the other hand by the source of negative voltage $V^-$.

Generating block $B_1$ also receives the signal $REF_\phi$ representative of a phase reference, generated by waveform generator Osc.

Figure 2:
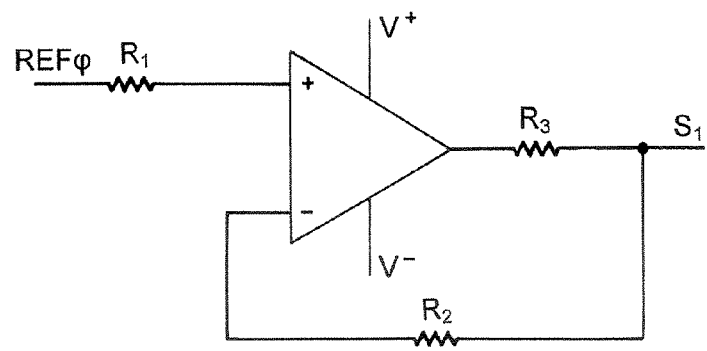
FIG. 2 shows a possible example of use of a first generating block of the generator of FIG. 1.

Generating block $B_1$ delivers an a.c. signal $S_1$, whose phase is equal to that of the signal $REF_\phi$ received from waveform generator Osc. As illustrated in FIG. 2, generating block $B_1$ is constructed, for example, from an operational amplifier mounted in a follower circuit. The operational amplifier is supplied respectively by the positive voltage $V^+$ and the negative voltage $V^-$ received from stabilized power supply Alim, in such a way that the positive alternations of the delivered periodic signal $S_1$ are in fact generated by means of the source of positive voltage $V^+$, while the negative alternations of this signal are generated by means of the source of negative voltage $V^-$.

In the follower circuit of FIG. 2, a first resistor $R_1$, in the present case having a value of 10 kΩ, receives the phase reference signal $REF_\phi$ at one end, the other end being connected to the "+" input of the operational amplifier. A resistor $R_2$, in the present case also having a value of 10 kΩ, is additionally connected between the "−" input and the output of the operational amplifier (with interposition of a third resistor $R_3$, in the present case having a value of 10Ω, for protection against short circuits), in order to form a feedback loop.

By using the same sources of positive and negative voltages $V^+$ and $V^-$ and the same phase reference signal $REF_\phi$, generating block $B_2$ in turn delivers a periodic a.c. signal $S_2$ in phase opposition relative to phase reference $REF_\phi$, or in other words phase-shifted by 180° relative to this reference signal $REF_\phi$.

Figure 3:
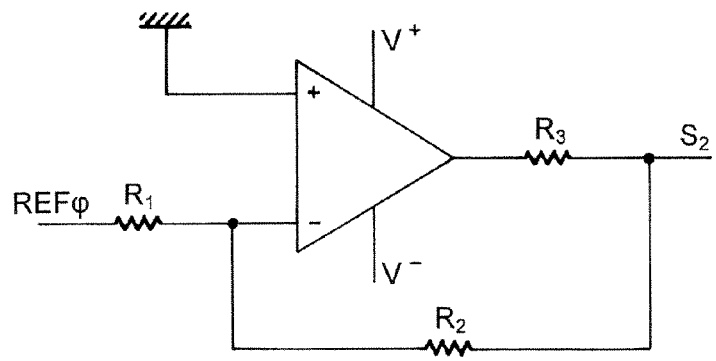
FIG. 3 shows a possible example of use of a second generating block of the generator of FIG. 1.

To achieve this, power supply block $B_2$ is constructed, for example, from an inverter circuit with an operational amplifier base, as illustrated in FIG. 3, where reference signal $REF_\phi$ undergoes inversion to obtain the desired phase shift of 180°. In such an inverter set-up, the "+" input of the operational amplifier is maintained at ground, while phase reference signal $REF_\phi$ is transmitted to the "−" input of the operational amplifier across a resistor $R_1$, while a resistor $R_2$ connects the "−" input and the output of the operational amplifier (with interposition of a resistor $R_3$) in order to generate signal $S_2$ at the output of the operational amplifier.

As for generating block $B_1$, the positive alternations of alternating signal $S_2$ are generated by means of the source of positive voltage $V^+$, and the negative alternations of this same signal are generated by means of the source of negative voltage $V^-$.

Figure 4:
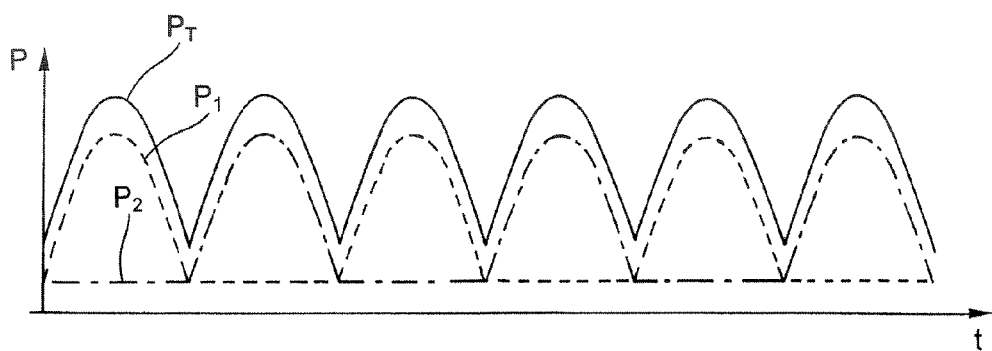
FIG. 4 shows the current consumption at the positive voltage source of the generator of FIG. 1.

It nevertheless is noted that the positive alternations of signal $S_1$ correspond in time to the negative alternations of signal $S_2$, by virtue of the phase shift of 180° existing between these two signals, in such a way that, for each source of voltage $V^+$ and $V^-$, the current is alternately consumed essentially by one of the two generating blocks $B_1$ and $B_2$, as illustrated in FIG. 4.

In this figure there are shown the consumed powers $P_1$, $P_2$ respectively supplied by the source of positive voltage $V^+$ to each generating block $B_1$, $B_2$ and the total consumed power $P_T$ resulting from the addition of the said two powers. (To simplify the description here, it is considered that generating blocks $B_1$ and $B_2$ each constitute loads of the same power, although in the precise case of FIG. 1 the mean power consumed by $B_1$ is greater than that consumed by $B_2$ if sensors $C_1$, $C_2$, $C_3$ mentioned hereinafter are of the same nature).

In the example described here, the signals have an amplitude of 100 mA. It also is noted that each generating block $B_1$, $B_2$ (and precisely the operational amplifier that it contains) consumes a minimum current (quiescent current), in this case of 25 mA.

Thus it is clearly seen that, instead of causing consumption peaks at certain instants of each period, the phase shift used makes it possible to distribute the current consumption over the period, thus limiting the variations of consumed power.

The current consumption behavior in the source of negative voltage $V^-$ is entirely similar, since this voltage source is loaded alternatively by generating block $B_2$ and then $B_1$, and the consumption variations are also limited in this source of negative voltage $V^-$.

Each of the a.c. signals $S_1$ and $S_2$ produced in this way is used as reference signal in one or more sensors, independently of one another.

In the example illustrated in FIG. 1, a.c. signal $S_1$ is used as reference signal in a first sensor $C_1$ and in a second sensor $C_2$. A.c. signal $S_2$ in turn is used as reference signal in a third sensor $C_3$.

Sensors $C_1$, $C_2$, $C_3$ (or, in a conceivable alternative version, only some of them) are in the present case inductive sensors, such as position sensors of control mechanisms of the aircraft, and at the output they each deliver a signal $V_1$, $V_2$, $V_3$ representative of the position measured by the sensor, because of the fact that reference signal $S_1$ or $S_2$ at the input is predetermined. It would also be possible to use differential sensors, each delivering two signals at the output.

The measurement effected by each of sensors $C_1$, $C_2$, $C_3$ is all the more precise the more regular are the characteristics of reference signals $S_1$ or $S_2$.

Figure 5:
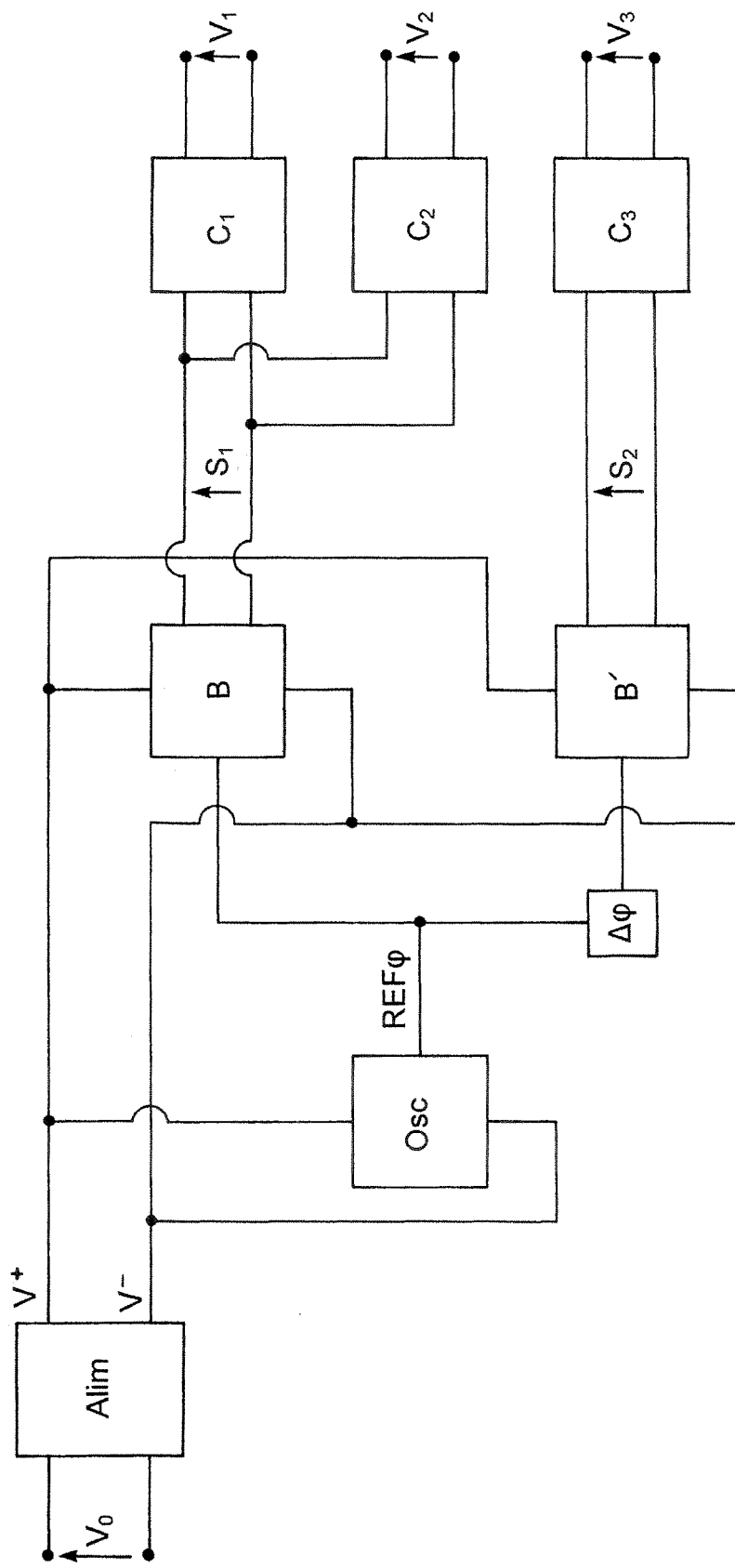
FIG. 5 shows a second example of use of the invention.

FIG. 5 shows a second example of the use of the invention.

The a.c. signal generator of FIG. 5, just as that of FIG. 1, is provided with a stabilized power supply Alim, which forms a source of positive voltage $V^+$ and a source of negative voltage $V^-$.

The generator of FIG. 5 is also provided with a waveform generator Osc, supplied by the sources of voltage $V^+$ and $V^-$ and delivering, as in the case of the first practical example, a signal $REF_\phi$ representative of a phase reference.

The generator of FIG. 5 is provided with two generating blocks B and B', which in this case have the same structure, for example such as that illustrated for block $B_1$ in the first embodiment with reference to FIG. 2.

Generating block B receives phase reference signal $REF_\phi$ directly from waveform generator Osc, and on the basis of this signal $REF_\phi$ and by means of the sources of positive voltage $V^+$ and negative voltage $V^-$, it delivers an a.c. signal $S_1$ by functioning in a manner similar to that of block $B_1$ described hereinabove.

Generating block B', with structure identical to generating block B as already mentioned, in turn receives phase reference signal $REF_\phi$ across a phase-shifting device $\Delta\phi$, which in this case is constructed in the form of an inverter circuit, which multiplies the input signal by −1, or in other words applies a phase shift of 180° to this signal. This inverter circuit is constructed, for example, by means of an operational amplifier mounted as an inverter.

Alternatively, it would be possible to use a phase-shifting device of a different type, such as a retarder circuit, especially if it is wished to obtain a phase shift (non-zero) different from 180°.

Generating block B' delivers an a.c. signal $S_2$ in phase with the signal delivered by inverter $\Delta\phi$ that it receives at the input, with positive and negative alternations supplied respectively by the source of positive voltage $V^+$ and the source of negative voltage $V^-$.

Thus, by virtue of the use of phase-shifting circuit $\Delta\phi$ and of the fact that generating blocks B and B' each deliver a signal in phase with the signal that they receive at the input, a.c. signals $S_1$ and $S_2$ are phase-shifted by 180° relative to one another.

Each source of voltage $V^+$, $V^-$ is therefore loaded alternatively by each of the two generating blocks B, B', as in the first embodiment described hereinabove, in such a way that the variations of consumed current (and therefore of consumed power) in each source are reduced as explained hereinabove.

It will be noted that, in the example illustrated in FIG. 5, a.c. signals $S_1$, $S_2$ are used in a manner analogous to that provided in the first embodiment of FIG. 1, or in other words as reference signals, each signal being intended for one or more independent sensors.

Of course, the two embodiments just presented constitute only possible examples of use of the invention.

Figure 6:
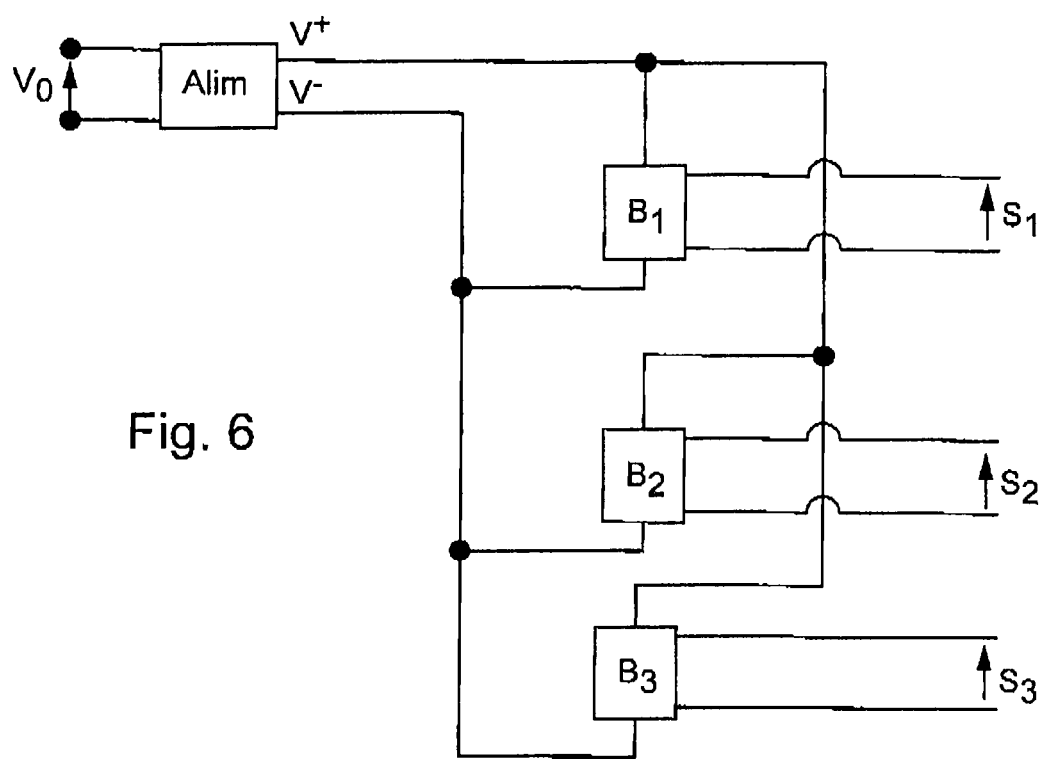
FIG. 6 shows an a.c. signal generator according to an embodiment of the invention.

For example, it would be possible to use more than two generating blocks supplied by the same sources of positive and negative voltages, wherein the a.c. signals generated by at least two blocks are phase-shifted relative to one another in order to avoid concentration of current consumption at precise instants and in this way to limit the current consumed in each voltage source. For example, FIG. 6 shows three generating blocks, $B_1$, $B_2$ and $B_3$ that output three a.c., signals $S_1$, $S^2$, and $S_3$, respectively.

When more than two signal-generating blocks are used, it is possible to provide for assembly of these blocks into groups of blocks, the blocks of each group generating a.c. signals in phase, whereas the signals generated by the blocks of two different groups are phase-shifted relative to one another. When more than two groups are used, the phases associated with each of the groups are distributed (preferably equally) over the entire range of conceivable values.

Alternatively, it can be provided that each generating block delivers a signal with a specific phase, different from the phase of all other signals; the phases of the different signals are then preferably distributed (indeed, equally so) over the entire range of conceivable values (in other words, generally from 0° to 360°).

Finally, it is provided in the described examples that a single waveform generator Osc is used and then a.c. signals $S_1$, $S_2$ having different phases relative to this reference are delivered. Alternatively, it would be possible to envision the use of a plurality of waveform generators in this way generating phase reference signals phase-shifted relative to one another, as well as the use of these phase reference signals in order to produce a.c. signals phase-shifted relative to one another.

The invention claimed is:

1. A generator of a.c. signals, comprising:
   a voltage source which outputs a first potential and a second potential;
   a first circuit which receives the first potential and the second potential, and generates alternations of a first a.c. signal between the first potential and the second potential, said first a.c. signal being input to a first inductive position sensor; and
   a second circuit which receives the first potential and the second potential, and generates alternations of a second a.c. signal, phase-shifted relative to the first a.c. signal, between the first potential formed by the voltage source and the second potential in such a manner that the voltage source is loaded alternately by the first circuit and by the second circuit, said second a.c. signal being input to a second inductive position sensor independent from said first inductive position sensor.

2. The generator according to claim 1, wherein the first a.c. signal and the second a.c. signal each have a phase that is determined relative to a phase reference signal.

3. The generator according to claim 2, further comprising a waveform generator which delivers the phase reference signal to both the first circuit and the second circuit.

4. The generator according to claim 2, wherein the first circuit receives the phase reference signal and generates the first a.c. signal in phase with the phase reference signal, and in that the second circuit receives the phase reference signal and generates the second a.c. signal with a phase shift relative to the phase reference signal.

5. The generator according to claim 4, wherein the second circuit includes an inverter circuit.

6. The generator according to claim 2, wherein the first circuit receives the phase reference signal and generates the first a.c. signal in phase with the phase reference signal, and in that the second circuit receives the phase reference signal via a phase-shifting unit and generates the second a.c. signal in phase with the signal received from the phase-shifting unit.

7. The generator according to claim 6, wherein the phase-shifting unit includes an inverter circuit.

8. The generator according to claim 1, wherein the voltage source includes a first voltage source and a second voltage source, the first potential is formed by the first voltage source, the second potential is formed by the second voltage source, and wherein the second voltage source is loaded alternately by the first circuit and by the second circuit.

9. The generator according to claim 1, wherein the first a.c. signal and the second a.c. signal are reference signals.

10. The generator according to claim 1, wherein the first a.c. signal and the second a.c. signal are phase-shifted by 180° relative to one another.

11. The generator according to claim 10, wherein the first and second sensors are such that they permit a phase shift between the first a.c. signal and the second a.c. signal.

12. A flight control calculator of an aircraft, wherein it is equipped with the a.c. signal generator according to claim 1.

13. An aircraft, wherein it is equipped with the a.c. signal generator according to claim 1.

14. An aircraft, wherein it is equipped with the flight control calculator according to claim 12.

15. The generator according to claim 1, further comprising:
   a third circuit capable of generating alternations of a third a.c. signal, in phase relative to the first a.c. signal, between the first potential formed by the voltage source and the second potential.

16. The generator according to claim 1, further comprising:
   a third circuit capable of generating alternations of a third a.c. signal, phase-shifted relative to the first a.c. signal and the second a.c. signal, between the first potential formed by the voltage source and the second potential.

\* \* \* \* \*